United States Patent [19]

Egashira et al.

[11] Patent Number: 5,264,002
[45] Date of Patent: Nov. 23, 1993

[54] METHOD FOR CONVEYING SEMICONDUCTOR LEAD FRAME STRIP WITH AN APPARATUS HAVING VERTICALLY MOVABLE GUIDE RAILS

[75] Inventors: Toshiyuki Egashira; Masahiro Ishizuka; Toshinobu Banjou, all of Fukuoka, Japan

[73] Assignee: Mitsubishi Danki Kabushiki Kaisha, Tokyo, Japan

[21] Appl. No.: 969,384

[22] Filed: Oct. 30, 1992

Related U.S. Application Data

[62] Division of Ser. No. 688,295, Apr. 22, 1991, Pat. No. 5,186,719.

[30] Foreign Application Priority Data

Apr. 23, 1990 [JP] Japan .................................. 2-105463

[51] Int. Cl.⁵ .............................................. H01L 21/58
[52] U.S. Cl. .............................. 29/25.01; 437/206; 437/220; 228/4.5
[58] Field of Search ............... 29/25.01, 740, 741; 437/206, 220, 209 WB, 925; 228/4.5, 180.2; 414/591, 618

[56] References Cited

U.S. PATENT DOCUMENTS

| | | | |
|---|---|---|---|
| 3,812,947 | 5/1974 | Nygaard | 198/19 |
| 3,887,996 | 6/1975 | Hartleroad et al. | 39/583 |
| 4,643,629 | 2/1987 | Takahashi et al. | 414/331 |
| 5,082,165 | 1/1992 | Ishizuka | 228/179 |

FOREIGN PATENT DOCUMENTS

| | | |
|---|---|---|
| 3237617 | 6/1983 | Fed. Rep. of Germany . |
| 58-58729 | 4/1983 | Japan . |
| 58-223342 | 12/1983 | Japan . |
| 59-18667 | 1/1984 | Japan . |
| 60-130128 | 7/1985 | Japan . |
| 61-20339 | 1/1986 | Japan . |
| 62-150832 | 7/1987 | Japan . |
| 64-13733 | 1/1989 | Japan . |
| 64-28829 | 1/1989 | Japan . |

*Primary Examiner*—Olik Chaudhuri
*Assistant Examiner*—David E. Graybill
*Attorney, Agent, or Firm*—Leydig, Voit & Mayer

[57] ABSTRACT

A method for conveying a continuous semiconductor lead frame strip includes a guide rail for conveying a lead frame, the guide rail being divided into three portions having a vertically movable central guide rail portion opposite a heat block and fixed first and second guide rail portions on opposite sides of the central portion. The accuracy of conveyance of the strip is not decreased by the vertical movement of the central guide rail. Clamp claws grasping and conveying the strip at each fixed guide rail portion operate within the respective fixed guide rail portions and do not move vertically with the central guide rail.

1 Claim, 4 Drawing Sheets

METHOD FOR CONVEYING SEMICONDUCTOR LEAD FRAME STRIP WITH AN APPARATUS HAVING VERTICALLY MOVABLE GUIDE RAILS

This application is a division of application Ser. No. 07/688,295, filed Apr. 22, 1991 now U.S. Pat. No. 5,186,719.

BACKGROUND OF THE INVENTION

Field of the Invention

The present invention relates to an apparatus and method for conveying a semiconductor frame.

Description of the Related Art

FIG. 3 is a perspective view of a conventional apparatus for conveying a semiconductor frame. In the process of producing a semiconductor device, the semiconductor frame 4 is conveyed by a clamp unit 5 on a movable guide rail portion 3 in the direction shown by an arrow in the drawing. The movable guide rail portion 3 is vertically moved by a vertical driving mechanism (not shown) provided under bearings 3a. The clamp unit 5 has upper and lower clamp claws 5a, 5b provided on the upstream side of the direction of conveyance and upper and lower clamp claws 5c, 5d provided on the downstream side of the direction of conveyance so as to vertically hold the semiconductor frame 4 (referred to as "lead frame" hereinafter). The clamp unit 5 also has a horizontal driving mechanism for moving the lead frame 4 in the direction of conveyance, which mechanism comprises a tapped hole 7a and a driving screw 7b which engages the threads of the tapped the hole 7a. The clamp claws 5a, 5b on the upstream side and the clamp claws 5c, 5d on the downstream side are synchronously operated. A heat block 1 is provided for heating the lead frame 4 conveyed on the movable guide rail portion 3 and is fixed to fixed board (not shown). A frame presser 2 presses or holds down the lead frame 4 on the heat block 1 and is vertically driven with predetermined timing by a driving mechanism which has the same system as that of the driving mechanism for the movable guide rail portion 3 and which is provided under a bearing 2a. The frame presser 2 is also provided with a working hole 2b. FIGS. 4A to 4G are side views showing a method of conveying the lead frame 4, and particularly showing the operation of the upper and lower clamp claws 5a, 5b of the clamp unit 5 on the upstream side of the direction of conveyance.

The operation is described below with reference to FIGS. 3 and 4A to 4G. When the lead frame 4 is conveyed to a portion between the upper and lower clamp claws 5a and 5b on the upstream side, for example, by a belt conveyor (not shown) or the like, as shown in FIG. 4A, the lower clamp claw 5b on the upstream side is upwardly moved, and the upper clamp claw 5a is downwardly moved so that the lead frame 4 is held and fixed therebetween, as shown in FIG. 4B. The clamp claws 5a, 5b are then upwardly moved while clamping the lead frame 4 therebetween, and the movable guide rail portion 3 is also upwardly moved to the same height as that of the clamp claws, as shown in FIG. 4C. The driving screw 7b is then rotated so that the lead frame 4 is conveyed for a predetermined length, as shown in FIG. 4D. Then the movable guide rail portion 3 and the clamp claws 5a, 5b are downwardly moved, as shown in FIG. 4E. The clamp claws 5a, 5b then release the lead frame 4 from the clamping, as shown in FIG. 4F. Further, the driving screw 7b is rotated in the reverse direction so that the clamp claws 5a, 5b are returned to the initial position, as shown in FIG. 4G. The operating steps shown in FIGS. 4B to 4G are repeated so that the lead frame 4 is intermittently conveyed. When the lead frame 4 is placed on the heat block 1 (refer to FIG. 3), the frame presser 2 is downwardly moved so that the lead frame 4 is urged toward the heat block 1. Wire bonding work or the like is carried out on the lead frame 4 through the working hole 2b of the frame presser 2. When the work is completed, the frame presser 2 is upwardly moved. After the operating steps shown in FIGS. 4B to 4G, the frame presser is again downwardly moved, and wire bonding work or the like is carried out in a next portion of the lead frame 4. The work is progressed by repeating the above operating steps. The movable guide rail portion 3 is upwardly moved during conveyance of the lead frame in order to avoid the contact between the upper surface of the heat block 1 and the lower surface of the lead frame 4. The clamp claws 5c, 5d on the downstream side of the direction of conveyance shown in FIG. 3 convey the lead frame 4 after the work is completed. The clamp claws 5c, 5d are operated in the same manner as the clamp claws 5a, 5b on the upstream side.

The conventional apparatus for conveying a semiconductor frame has the problems described below. Since the whole guide rail portion is vertically moved, when a semiconductor frame is conveyed by the clamp claws, the conveyance is constantly affected by the vertical movement of the guide rail portion, thereby decreasing the accuracy of conveyance of a lead frame. In addition, since the clamp unit and the lead frame must be vertically moved according to the movement of the guide rail portion after the lead frame is clamped by the clamp claws, a complicated mechanism is required.

SUMMARY OF THE INVENTION

The present invention has been achieved with a view to solving the above problems, and it is an object of the present invention to provide an inexpensive apparatus for conveying a semiconductor frame with a simple structure preventing the accuracy of conveyance of a lead frame from being decreased by the vertical movement of a guide rail portion, and which comprises clamp claws which are not vertically moved after the lead frame has been vertically held and clamped between the claws. This invention also concerns a method of conveying a semiconductor frame.

In order to achieve the objects, the present invention provides an apparatus for conveying a semiconductor frame and positioning it on a working/processing unit. The apparatus comprises a movable guide rail portion being movable in a vertical direction with the working/processing unit placed at the center of the movable guide rail portion and supported and fixed on a fixed board for working or processing a semiconductor frame, fixed guide rail portions respectively supported and fixed by the fixed board at positions on the extensions from both sides of the movable guide rail portion, and a clamp unit having upper and lower clamp claws which vertically clamp the semiconductor frame conveyed to each of the fixed guide rail portions, movable along the fixed guide rail portions while clamping the semiconductor frame, and which are provided at a position corresponding to each of the fixed guide rail portions on the both sides of the movable guide rail portion, wherein the movable guide rail portion is upwardly moved during the conveyance of the semiconductor frame along the movable guide rail portion so that the semiconductor frame does not contact the working/processing unit.

The present invention provides a method of intermittently conveying a semiconductor frame along the guide rail unit by using the upper and lower clamp claws provided at a position corresponding to each of the fixed guide rail portions in a guide rail unit divided into three portions involving the movable guide rail portion which is vertically moved and has a heat block disposed in the central portion thereof and supported and fixed on a fixed board, and the two fixed guide rail portions provided at both sides of the movable guide rail portion. The method comprises clamping the semiconductor frame by the upper and lower clamp claws on the upstream side of the direction of conveyance and moving the semiconductor frame for a predetermined length along the fixed guide rail portion on the upstream side toward the movable guide rail portion, and returning the clamp claws, which are opened, to the initial position so that the frame is again clamped and conveyed until the front end of the semiconductor frame reaches a position on the movable guide rail portion; lifting the movable guide rail portion when the frame reaches a position on the movable guide rail portion so as to prevent the frame from contacting the heat block; further conveying the frame by the same method as that in the first step, downwardly moving the movable guide rail portion together with the frame when a predetermined portion of the frame is placed on the heat block, lifting the movable guide rail portion when predetermined work or processing is completed, and conveying the frame until a next predetermined portion thereof is placed on the heat block, the step being repeated at least once; conveying the frame by the upper and lower clamp claws on the downstream side of the direction of conveyance to a position on the fixed guide rail portion on the downstream side by the same method as in the first conveying step when the working or processing is completed; and lowering the movable guide rail portion when the rear end of the frame reaches the fixed guide rail portion on the downstream side of the direction of conveyance.

In the present invention, the semiconductor lead frame can be conveyed without being affected by the vertical movement of the guide rail portion to a position immediately before the heat block. In addition, since the guide rail portions are fixed within the region where the clamp claws are operated, the clamp claws need not be vertically moved according to the upward or downward movement of the guide rail portion, as shown in the conventional apparatus.

DESCRIPTION OF THE PREFERRED EMBODIMENTS

Figure 1:
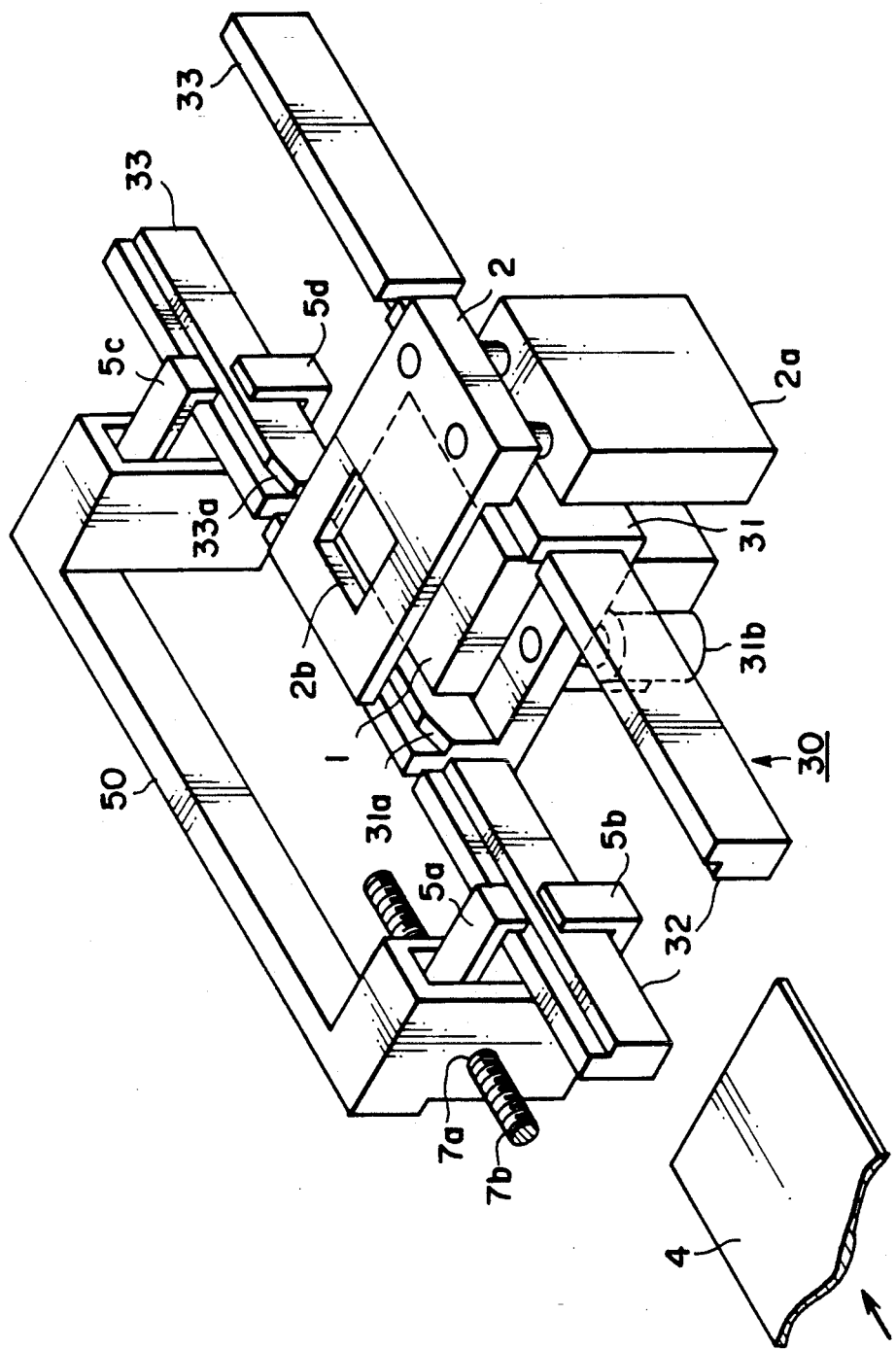
FIG. 1 is a perspective view of an apparatus for conveying a semiconductor frame in accordance with an embodiment of the present invention.
Figure 2A:
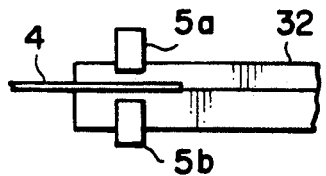
FIGS. 2A to 2G are side views showing the operation of the conveying apparatus shown in FIG. 1.
Figure 2B:
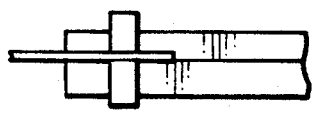
Figure 2C:
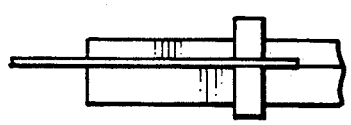
Figure 2D:
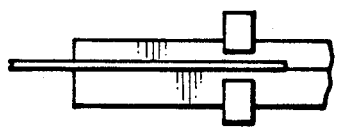
Figure 2E:
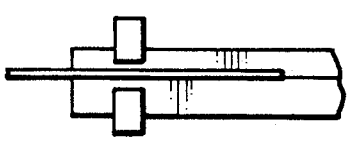

An embodiment of the present invention is described below with reference to the drawings. FIG. 1 is a perspective view showing an apparatus for conveying a semiconductor frame according to an embodiment of the present invention. In the drawing, the portions denoted by the same reference numerals as those shown in FIG. 3 are the same or corresponding portions. A guide rail unit 30 has a movable guide rail portion 31 at the center thereof and fixed guide rail portions 32, 33 on both sides thereof. The central movable guide rail portion 31 is connected to a driving mechanism, e.g., including a compressor and pistons (not shown), through bearings 31b or the like, as in conventional apparatus. The movable guide rail portion 31 and the fixed guide rail portion 33 have inclined surfaces 31a, 33a, respectively, for smoothly conveying a lead frame 4 (if required, a inclined surface may also be formed in the fixed guide rail portion 32). FIGS. 2A to 2G are side views showing the method of conveying the lead frame 4 in the conveying apparatus shown in FIG. 1.

The operation is described below with reference to FIGS. 1 and 2A to 2G. As shown in FIG. 2A, the lead frame 4 is conveyed to a portion between the upper and lower clamp claws 5a, 5b on the upstream side of the direction of conveyance, for example, by a belt conveyor (not shown) or the like. As shown in FIG. 2B, the lower clamp claw 5b on the upstream side is upwardly moved, and the upper clamp claw 5a is downwardly moved so that the lead frame 4 is clamped. The driving screw 7b shown in FIG. 1 is then rotated and moves the clamped lead frame 4 in the direction of conveyance so as to convey the lead frame 4 for a predetermined length, as shown in FIG. 2C. As shown in FIG. 2D, then the clamp claws 5a, 5b release the lead frame 4. As shown in FIG. 2E, when the driving screw 7b is rotated in the reverse direction, the clamp claws are returned to their initial position.

Figure 2F:
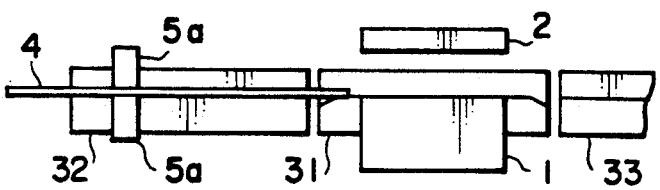
Figure 2G:
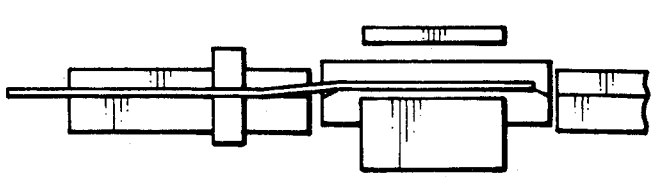
Figure 3:
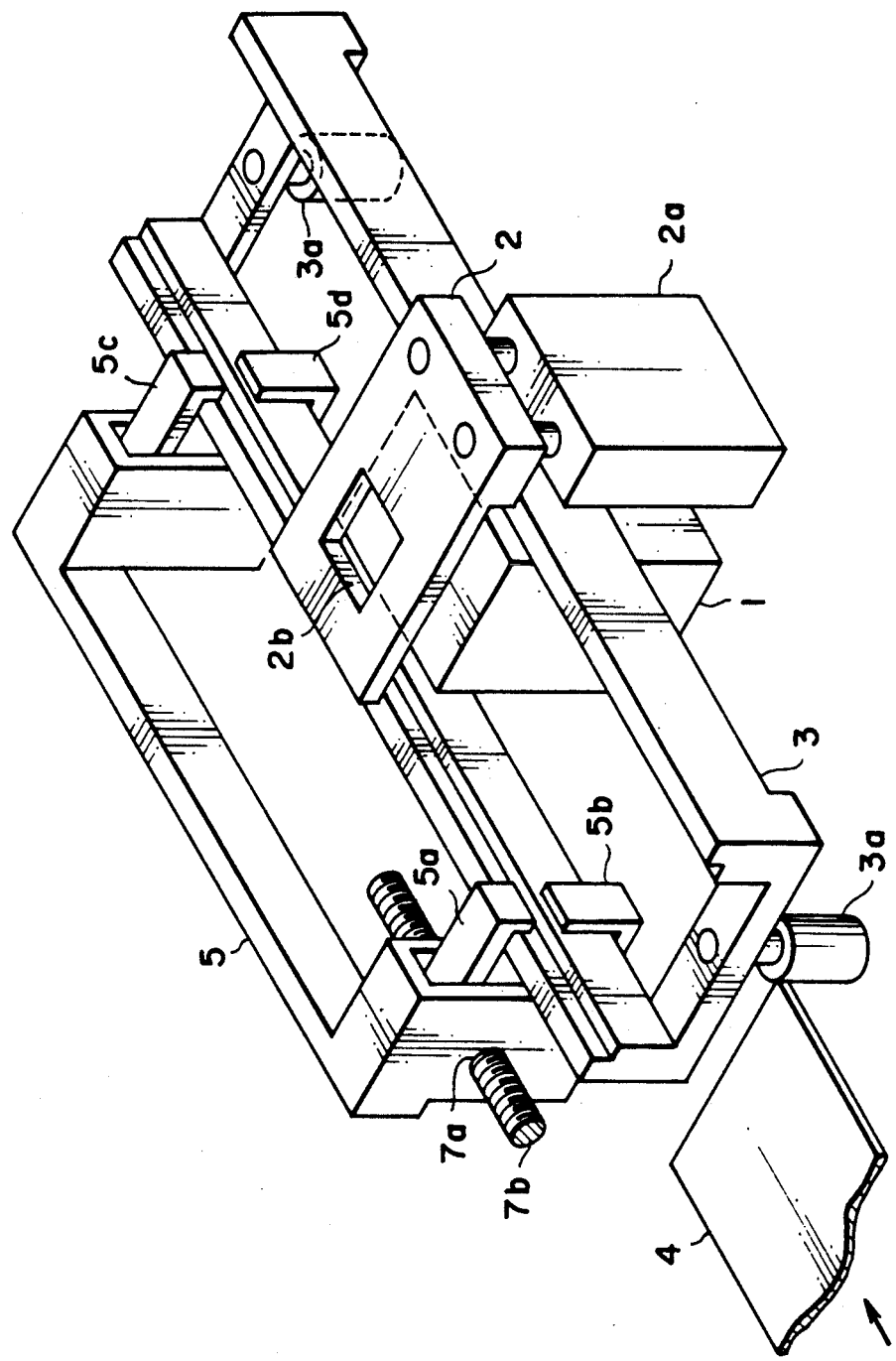
FIG. 3 is a perspective view of a conventional apparatus for conveying a semiconductor frame.
Figure 4A:
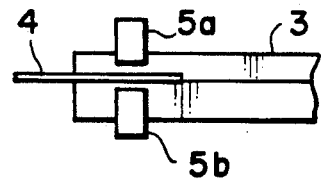
FIGS. 4A to 4G are side views showing the operation of the conveying apparatus shown in FIG. 3, with a guide rail portion on the upstream side removed therefrom.
Figure 4B:
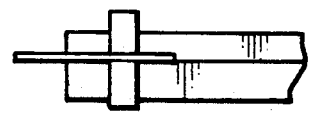
Figure 4C:
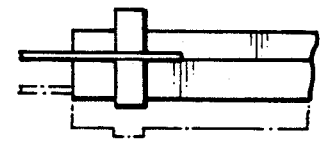
Figure 4D:
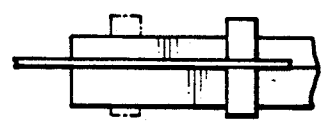
Figure 4E:
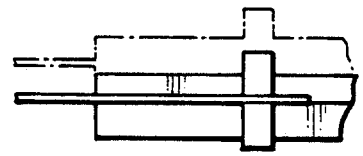
Figure 4F:
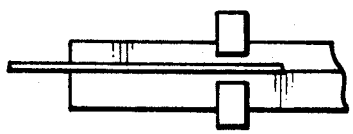
Figure 4G:
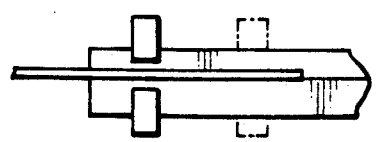

The operating steps shown in FIGS. 2A to 2E are repeated and when a front end of the lead frame 4 reaches a portion on the movable guide rail portion 31 as shown in FIG. 2F, the guide rail portion 31 is lifted up in order to avoid the contact between the lead frame 4 and the heat block 1, as shown in FIGS. 2F and 2G. During the conveyance of the lead frame 4 on the movable guide rail portion 31, when a predetermined portion of the lead frame 4 reaches the heat block 1, the movable guide rail portion 31 and a frame presser 2 are downwardly moved so that the lead frame 4 is urged toward the heat block 1. Wire bonding work or the like is carried out on the predetermined portion of the lead frame 4 through a working hole 2b of the frame presser 2. When the work is completed in the predetermined portion, the movable guide rail portion 31 and the frame presser 2 are upwardly moved. After the operating steps shown in FIGS. 2A to 2E, the movable guide rail portion 31 and the frame presser 2 are again downwardly moved, and wire bonding or the like is carried out in a next predetermined portion of the lead frame 4. The work progresses by repeating the above operating steps. Clamp claws 5c, 5d on the downstream side of the direction of conveyance convey the lead frame 4 after the lead frame 4 has passed through the heat block 1. The clamp claws 5c, 5d are operated in the same manner as the above clamp claws 5a, 5b on the upstream side. When a rear end of the frame reaches the fixed guide rail portion 33 on the downstream side of the direction of conveyance, the movable guide rail portion 31 is lowered.

Although the above embodiment concerns a case which uses as the working/processing unit the heat block, for example, in wire bonding or the like, the present invention is not limited to this process, and other working/processing units may be used, producing the same effect as that described above.

As described above, in the present invention, the guide rail for conveying the lead frame is divided into three portions so that only the central portion of the guide rail where the heat block is located is upwardly moved, the other portions of the guide rail on both sides being stationary. It is therefore possible to prevent the accuracy of conveyance from being decreased by vertical movement of the guide rail. In addition, since the clamp claws are operated within the regions of the stationary guide rail portions, it is unnecessary to upwardly or downwardly move the clamp unit according to the upward or downward movement of the guide rail. The present invention thus has the effect of simplifying the driving mechanism and decreasing the cost of the apparatus.

What is claimed is:

1. A method of intermittently conveying a continuous strip of semiconductor frames across a guide rail unit divided into three portions including a central vertically movable guide rail portion, a heat block disposed centrally relative to the movable guide rail portion, and first and second fixed guide rail portions respectively disposed on opposite sides of said movable guide rail portion and a pair of upper and lower clamp claws respectively disposed at each of the first and second fixed guide rail portions for clamping and intermittently moving the strip, said method comprising:

clamping the strip in upper and lower clamp claws by closing the clamp claws at a first fixed guide rail portion at a first position;

moving said strip a predetermined distance along the first fixed guide rail portion toward the movable guide rail portion by moving the clamp claws at the first fixed guide rail portion to a second position;

opening the clamp claws at the first fixed guide rail portion to release the strip and returning the clamp claws at the first fixed guide rail portion to the first position;

continuing the foregoing clamping, moving, and opening steps repeatedly until the strip reaches the movable guide rail portion;

lifting the movable guide rail portion to avoid contact between the strip and the heat block when the strip reaches the movable guide rail portion;

vertically moving the movable guide rail portion and the strip when the strip reaches a predetermined position relative to the heat block;

processing the frame in the strip opposite the heat block;

clamping the strip in upper and lower clamp claws by closing the clamp claws at a second fixed guide rail portion at a first position;

moving said strip a predetermined distance along the second fixed guide rail portion away from the movable guide rail portion by moving the clamp claws at the second fixed guide rail portion to a second position; and opening the clamp claws at the second fixed guide rail portion to release the strip and returning the clamp claws at the second fixed guide rail portion to the first position.

* * * * *